(12) United States Patent
Kim et al.

(10) Patent No.: US 12,477,944 B2
(45) Date of Patent: Nov. 18, 2025

(54) SOLAR CELL AND METHOD FOR MANUFACTURING SAME

(71) Applicant: JUSUNG ENGINEERING CO., LTD., Gwangju-si (KR)

(72) Inventors: Jae Ho Kim, Gwangju-si (KR); Chul Joo Hwang, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 0 days.

(21) Appl. No.: 18/276,031

(22) PCT Filed: Feb. 22, 2022

(86) PCT No.: PCT/KR2022/002550
§ 371 (c)(1),
(2) Date: Aug. 5, 2023

(87) PCT Pub. No.: WO2022/196962
PCT Pub. Date: Sep. 22, 2022

(65) Prior Publication Data
US 2024/0138162 A1    Apr. 25, 2024

(30) Foreign Application Priority Data
Mar. 16, 2021    (KR) .......................... 10-2021-0033921

(51) Int. Cl.
*H10K 85/50*    (2023.01)
*H10K 30/40*    (2023.01)
*H10K 30/50*    (2023.01)

(52) U.S. Cl.
CPC ............. *H10K 85/50* (2023.02); *H10K 30/40* (2023.02); *H10K 30/50* (2023.02)

(58) Field of Classification Search
CPC ........ H10K 30/40; H10K 30/50; H10K 30/57; H10K 30/10; H10K 85/50
See application file for complete search history.

(56) References Cited

U.S. PATENT DOCUMENTS 10,730,894 B2    8/2020    Seok et al.
2017/0152608 A1    6/2017    Jin et al.
(Continued)

FOREIGN PATENT DOCUMENTS

CN        103700769 A    *    4/2014
CN        109411554 A         3/2019
(Continued)

OTHER PUBLICATIONS

KR 20190052981A English machine translation (Year: 2019).*
(Continued)

*Primary Examiner* — Andrew J Golden
(74) *Attorney, Agent, or Firm* — Renaissance IP Law Group LLP

(57) ABSTRACT

The present invention relates to a solar cell, including a perovskite solar cell including a light absorption layer including a perovskite compound and a conductive charge transporting layer included in at least one surface of one surface and the other surface of the light absorption layer, wherein the one surface of the light absorption layer is disposed closer to an incident surface for sunlight than the other surface of the light absorption layer, an optical band gap of an inner portion of the light absorption layer is constant or decreases toward the other surface from the one surface, and an optical band gap of the one surface of the light absorption layer is greater than an optical band gap of the other surface of the light absorption layer, and a method of manufacturing the solar cell.

7 Claims, 10 Drawing Sheets

(56) References Cited

U.S. PATENT DOCUMENTS

| | | | |
|---|---|---|---|
| 2018/0248118 A1* | 8/2018 | Kwok | H10K 85/50 |
| 2018/0350527 A1* | 12/2018 | Xu | H10K 85/50 |
| 2021/0091309 A1* | 3/2021 | Kim | H10K 85/50 |
| 2023/0337444 A1* | 10/2023 | Xie | H10K 30/50 |

FOREIGN PATENT DOCUMENTS

| | | | | |
|---|---|---|---|---|
| CN | 112259688 A * | 1/2021 | | H10K 30/10 |
| JP | 2019145621 A | 8/2019 | | |
| KR | 20190052981 A | 5/2019 | | |
| KR | 101998021 B1 | 7/2019 | | |
| KR | 20200096305 A | 8/2020 | | |
| KR | 20200132336 A | 11/2020 | | |
| KR | 2227526 B1 * | 3/2021 | | H01L 51/0001 |
| WO | WO-2019074616 A2 * | 4/2019 | | H10K 85/50 |
| WO | 2020081412 A1 | 4/2020 | | |

OTHER PUBLICATIONS

Brites et al., Ultrafast Low-Temperature Crystallization of Solar Cell Graded Formamidinium-Cesium Mixed-Cation Lead Mixed-Halide Perovskites Using a Reproducible Microwave-Based Process, ACS Appl. Energy Mater. 2019, 2, 1844-1853. (Year: 2019).*
CN-103700769-A English machine translation (Year: 2014).*
International Search Report for PCT/KR2022/002550 mailed Jun. 7, 2022.

* cited by examiner

SOLAR CELL AND METHOD FOR MANUFACTURING SAME

TECHNICAL FIELD

The present invention relates to a solar cell, and more particularly, to a solar cell to which a perovskite solar cell is applied.

BACKGROUND ART

In the related art, tandem solar cells where a perovskite solar cell is stacked on a bulk-type solar cell have been proposed. Perovskite solar cells absorb light having a short wavelength, and bulk-type solar cells absorb light having a long wavelength. Therefore, it is needed that a perovskite solar cell absorbs light having a short wavelength well and transmits light having a long wavelength well to enable light to be well transferred to a bulk-type solar cell for enhancing the efficiency of tandem solar cells.

When a thickness of a perovskite solar cell is thick, the perovskite solar cell does not transmit light having a long wavelength well, and thus, it is preferable that a thickness of the perovskite solar cell is formed to be thin. However, when a thickness of the perovskite solar cell is thinned, there is a problem where a current density is lowered.

Therefore, it is required to manufacture a perovskite solar cell which may well transmit light having a long wavelength and may increase a current density even if a thickness thereof is thin.

DISCLOSURE

Technical Problem

The present invention is devised to solve the above-described problem and is for providing a solar cell in which a thickness of a perovskite solar cell may be formed to be thin and a current density may increase, thereby enhancing efficiency.

Also, the present invention is for providing a method of manufacturing a solar cell, in which a solar cell may be manufactured by using a deposition process, and thus, a content of a halogen element in a light absorption layer may be easily adjusted.

Technical Solution

To accomplish the above-described objects, the present invention provides a solar cell including a perovskite solar cell including a light absorption layer including a perovskite compound and a conductive charge transporting layer included in at least one surface of one surface and the other surface of the light absorption layer, wherein the one surface of the light absorption layer is disposed closer to an incident surface for sunlight than the other surface of the light absorption layer, an optical band gap of an inner portion of the light absorption layer is constant or decreases toward the other surface from the one surface, and an optical band gap of the one surface of the light absorption layer is greater than an optical band gap of the other surface of the light absorption layer.

The light absorption layer may include a first halogen element and a second halogen element, an optical band gap of the first halogen element is greater than an optical band gap of the second halogen element, a content of the first halogen element included in the one surface of the light absorption layer may be higher than a content of the first halogen element included in the other surface of the light absorption layer, and a content of the second halogen element included in the one surface of the light absorption layer may be lower than a content of the second halogen element included in the other surface of the light absorption layer.

The present invention provides a solar cell including a perovskite solar cell including a light absorption layer including a perovskite compound and a conductive charge transporting layer included in at least one surface of one surface and the other surface of the light absorption layer, wherein the one surface of the light absorption layer is disposed closer to an incident surface for sunlight than the other surface of the light absorption layer, the light absorption layer includes a first halogen element and a second halogen element, a content of the first halogen element of an inner portion of the light absorption layer is constant or decreases toward the other surface from the one surface, and a content of the first halogen element of the one surface of the light absorption layer is higher than a content of the first halogen element of the other surface of the light absorption layer.

A content of the second halogen element of the one surface of the light absorption layer may be lower than a content of the second halogen element of the other surface of the light absorption layer.

An optical band gap of the first halogen element may be greater than an optical band gap of the second halogen element.

The light absorption layer may further include a third halogen element having an optical band gap which is less than an optical band gap of the first halogen element and is greater than an optical band gap of the second halogen element.

The light absorption layer may include a first layer where an optical band gap is smallest, a second layer where an optical band gap is medium, and a third layer where an optical band gap is largest, the first layer may be adjacent to the other surface of the light absorption layer, and the third layer may be adjacent to the one surface of the light absorption layer.

The light absorption layer may include a first halogen element and a second halogen element, an optical band gap of the first halogen element may be greater than an optical band gap of the second halogen element, and the first layer may include the second halogen element and may not include the first halogen element, the second layer may include all of the first halogen element and the second halogen element, and the third layer may include the first halogen element and may not include the second halogen element.

The light absorption layer may include a first halogen element and a second halogen element, an optical band gap of the first halogen element may be greater than an optical band gap of the second halogen element, each of the first layer, the second layer, and the third layer may include all of the first halogen element and the second halogen element, and a content of the first halogen element may be highest in the third layer and may be lowest in the first layer and a content of the second halogen element may be highest in the first layer and may be lowest in the third layer.

The light absorption layer may further include a third halogen element having an optical band gap which is less than an optical band gap of the first halogen element and is greater than an optical band gap of the second halogen element, and a content of the third halogen element may be higher in the second layer than the first layer or may be higher in the second layer than the third layer.

The light absorption layer may further include a third halogen element having an optical band gap which is less than an optical band gap of the first halogen element and is greater than an optical band gap of the second halogen element, and a content of the third halogen element may be uniform in the first layer, the second layer, and the third layer.

The solar cell may further include a buffer layer provided under the perovskite solar cell and a bulk-type solar cell provided under the buffer layer.

The present invention provides a method of manufacturing a solar cell, the method including: a process of forming a light absorption layer including a perovskite compound; and a process of forming a conductive charge transporting layer in at least one surface of one surface and the other surface of the light absorption layer, wherein the process of forming the light absorption layer includes a process of reacting at least one compound selected from an amine-based compound and an amidine-based compound, an organic metal compound including a divalent positive ion, and at least one hydrogen halide, the one surface of the light absorption layer is disposed closer to an incident surface for sunlight than the other surface of the light absorption layer, and an optical band gap of the one surface of the light absorption layer is greater than an optical band gap of the other surface of the light absorption layer.

The hydrogen halide may include first hydrogen halide and second hydrogen halide, an optical band gap of a first halogen element included in the first hydrogen halide may be greater than an optical band gap of a second halogen element included in the second hydrogen halide, a content of the first hydrogen halide supplied in forming the one surface of the light absorption layer may be higher than a content of the first hydrogen halide supplied in forming the other surface of the light absorption layer, and a content of the second hydrogen halide supplied in forming the one surface of the light absorption layer may be lower than a content of the second hydrogen halide supplied in forming the other surface of the light absorption layer.

The hydrogen halide may include first hydrogen halide and second hydrogen halide, an optical band gap of a first halogen element included in the first hydrogen halide may be greater than an optical band gap of a second halogen element included in the second hydrogen halide, a content of the first hydrogen halide supplied in forming the one surface of the light absorption layer may be higher than a content of the second hydrogen halide supplied in forming the one surface of the light absorption layer, and a content of the first hydrogen halide supplied in forming the other surface of the light absorption layer may be lower than a content of the second hydrogen halide supplied in forming the other surface of the light absorption layer.

A process of forming a bulk-type solar cell and a process of forming a buffer layer on the bulk-type solar cell may be further performed before forming the light absorption layer and the conductive charge transporting layer, and the light absorption layer and the conductive charge transporting layer may be formed on the buffer layer.

Advantageous Effect

According to the present invention, the following effects may be realized.

According to an embodiment of the present invention, an optical band gap of a light absorption layer may be formed to have various ranges, and thus, a thickness of a perovskite solar cell may be formed to be thin and a current density may increase, thereby enhancing the efficiency of a solar cell.

According to an embodiment of the present invention, because a perovskite compound is manufactured by reacting at least one compound selected from among an amine-based compound and an amidine-based compound, an organic metal compound including a divalent positive ion, and two or more hydrogen halide through a chemical vapor deposition (CVD) process, it is easy to adjust an optical band gap of a light absorption layer.

According to an embodiment of the present invention, a thin film may be formed through a chemical vapor deposition (CVD) process or an atomic layer deposition (ALD) process at a room temperature to 200° C., preferably, at a temperature of 50° C. to 150° C., and thus, an organic material of a finally obtained perovskite compound may be prevented from being decomposed in performing a CVD process or an ALD process.

According to an embodiment of the present invention, a light absorption rate, an optical band gap, carrier mobility, and material stability of a finally obtained perovskite compound may be adjusted based on the kind of the organic metal compound including the divalent positive ion.

MODE FOR INVENTION

Figure 1:
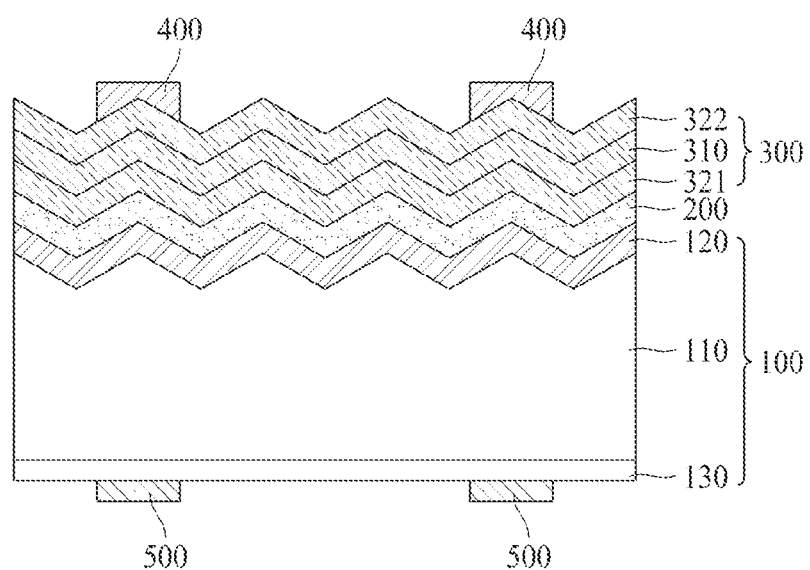
FIG. 1 is a cross-sectional view of a solar cell according to an embodiment of the present invention.

Advantages and features of the present invention, and implementation methods thereof will be clarified through following embodiments described with reference to the accompanying drawings. The present invention may, however, be embodied in different forms and should not be construed as limited to the embodiments set forth herein. Rather, these embodiments are provided so that this invention will be thorough and complete, and will fully convey the scope of the present invention to those skilled in the art. Furthermore, the present invention is only defined by scopes of claims.

A shape, a size, a ratio, an angle, and a number disclosed in the drawings for describing embodiments of the present invention are merely an example, and thus, the present invention is not limited to the illustrated details. Like reference numerals refer to like elements throughout. In the following description, when the detailed description of the relevant known technology is determined to unnecessarily obscure the important point of the present invention, the detailed description will be omitted. In a case where 'comprise', 'have', and 'include' described in the present specification are used, another part may be added unless 'only~' is used. The terms of a singular form may include plural forms unless referred to the contrary.

In construing an element, the element is construed as including an error range although there is no explicit description.

In describing a position relationship, for example, when a position relation between two parts is described as 'on~', 'over~', 'under~', and 'next~', one or more other parts may be disposed between the two parts unless 'just' or 'direct' is used.

In describing a time relationship, for example, when the temporal order is described as 'after~', 'subsequent~', 'next~', and 'before~', a case which is not continuous may be included unless 'just' or 'direct' is used.

It will be understood that, although the terms "first", "second", etc. may be used herein to describe various elements, these elements should not be limited by these terms. These terms are only used to distinguish one element from another. For example, a first element could be termed a second element, and, similarly, a second element could be termed a first element, without departing from the scope of the present invention.

The term "at least one" should be understood as including any and all combinations of one or more of the associated listed items. For example, the meaning of "at least one of a first item, a second item, and a third item" denotes the combination of all items proposed from two or more of the first item, the second item, and the third item as well as the first item, the second item, or the third item.

Features of various embodiments of the present invention may be partially or overall coupled to or combined with each other, and may be variously inter-operated with each other and driven technically as those skilled in the art can sufficiently understand. The embodiments of the present invention may be carried out independently from each other, or may be carried out together in co-dependent relationship.

Hereinafter, preferable embodiments of the present invention will be described in detail with reference to the accompanying drawings.

FIG. 1 is a cross-sectional view of a solar cell according to an embodiment of the present invention and relates to a tandem solar cell where a perovskite solar cell is stacked on a crystalline solar cell.

As seen in FIG. 1, the solar cell according to an embodiment of the present invention includes a crystalline solar cell 100, a buffer layer 200 which is formed on one surface (for example, a top surface) of the crystalline solar cell 100, a perovskite solar cell 300 which is formed on one surface (for example, a top surface) of the buffer layer 200, a first electrode 400 which is formed on one surface (for example, a top surface) of the perovskite solar cell 300, and a second electrode 500 which is formed on one surface (for example, a bottom surface) of the crystalline solar cell 100.

The crystalline solar cell 100 includes a semiconductor substrate 110 such as a wafer, a first semiconductor layer 120 which is doped with a certain dopant on one surface of the semiconductor substrate 110, and a second semiconductor layer 130 which is doped with a certain dopant on the other surface of the semiconductor substrate 110.

Furthermore, in the drawing, it is illustrated that the one surface of the semiconductor substrate 110 has a concave-convex structure, and thus, the first semiconductor layer 120 is also formed in a shape corresponding to a concave-convex structure, but the present invention is not limited thereto. The one surface of the semiconductor substrate 110 may have a flat structure, and the first semiconductor layer 120 may also have a flat structure.

Moreover, in the drawing, it is illustrated that the other surface of the semiconductor substrate 110 has a flat structure, and thus, the second semiconductor layer 130 is also formed in a flat structure, but the present invention is not limited thereto. The other surface of the semiconductor substrate 110 may be formed in a concave-convex structure, and the second semiconductor layer 130 may be formed in a shape corresponding to a concave-convex structure of the other surface of the semiconductor substrate 110.

The semiconductor substrate 110 may be formed of a P-type or N-type wafer, the first semiconductor layer 120 may be doped with a dopant having a polarity which differs from that of the semiconductor substrate 110, and the second semiconductor layer 130 may be doped with a dopant having the same polarity as that of the semiconductor substrate 110. For example, the semiconductor substrate 110 may be formed of a P-type wafer, the first semiconductor layer 120 may be doped with an N-type dopant, and the second semiconductor layer 130 may be doped with a P-type dopant and thus may be formed of a P+ layer.

The buffer layer 200 is formed on the first semiconductor layer 120. As the first semiconductor layer 120 is formed in a concave-convex structure, the buffer layer 200 is formed in a shape corresponding to a concave-convex structure. However, the present invention is not limited thereto. The one surface of the semiconductor substrate 110 may have a flat structure, and the buffer layer 200 may also have a flat structure.

The buffer layer 200 is provided between the crystalline solar cell 100 and the perovskite solar cell 300, and thus, the solar cell according to an embodiment of the present invention is formed in a structure of a tandem solar cell through a tunnel junction.

It is preferable that the buffer layer 200 is formed of a material which enables light having a long wavelength, passing through the perovskite solar cell 300, to be incident on the crystalline solar cell 100 without loss. For example, the buffer layer 200 may be formed of transparent conductive oxide, a carbon conductive material, a metal material, or a conductive polymer, and depending on the case, an n-type or p-type dopant may be doped on the material.

The perovskite solar cell 300 includes conductive charge transporting layers 321 and 322 and a light absorption layer 310.

The perovskite solar cell 300 may include one or more conductive charge transporting layers 321 and 322. For example, the perovskite solar cell 300 may include a first conductive charge transporting layer 321 provided on the buffer layer 200, the light absorption layer 310 provided on the first conductive charge transporting layer 321, and a second conductive charge transporting layer 322 provided on the light absorption layer 310. However, the present invention is not limited thereto, and the conductive charge transporting layers 321 and 322 may be disposed on only one surface of both surfaces of the light absorption layer 310.

The first conductive charge transporting layer 321 may be formed of an electron transporting layer, and the second conductive charge transporting layer 322 may be formed of a hole transporting layer. Alternatively, the first conductive charge transporting layer 321 may be formed of a hole transporting layer, the second conductive charge transporting layer 322 may be formed of an electron transporting layer.

The electron transporting layer may include a compound including an N-type organic material, such as bathocuproine (BCP), C60, or phenyl-C61-butyric acid methyl ester (PCBM), or a compound including various organic or inorganic materials and various N-type metal oxides such as ZnO, c-TiO$_2$/mp-TiO$_2$, SnO$_2$, or indium zinc oxide (IZO) known to those skilled in the art.

The hole transporting layer may include various P-type organic materials such as Spiro-MeO-TAD, Spiro-TTB, polyaniline, polyphenol, poly(3,4-ethylenedioxythiophene)-poly(styrenesulfonate) (PEDOT-PSS), poly[bis(4-phenyl)(2,4,6-trimethylphenyl)amine](PTAA), and poly(3-hexylthiophene-2,5-diyl) (P3HT) known to those skilled in the art, or may include a compound including various organic or inorganic materials and various P-type metal oxides such as Ni oxide, Mo oxide, V oxide, W oxide, or Cu oxide known to those skilled in the art.

The light absorption layer 310 includes a perovskite compound.

The perovskite compound according to an embodiment of the present invention includes at least one selected from a monovalent organic positive ion of an amine-based compound and a monovalent organic positive ion of an amidine-based compound, a divalent positive ion of an organic metal compound, and one or more halogen elements. In general Formula, the perovskite compound may be represented by ABX$_3$.

In the ABX$_3$, the A may consist of the monovalent organic positive ion of the amine-based compound, the monovalent organic positive ion of the amidine-based compound, or the monovalent organic positive ion of the amine-based compound and the monovalent organic positive ion of the amidine-based compound. The A may have a structure where the monovalent organic positive ion of the amine-based compound is included therein at an x ratio and the monovalent organic positive ion of the amidine-based compound is included therein at a y ratio. In this case, each of x and y is greater than 0, and x+y=1.

In the ABX$_3$, the B consists of the divalent positive ion of the organic metal compound.

In the ABX$_3$, the X consists of one or more halogen elements.

The amine-based compound may be selected from the group consisting of methylamine, ethylamine, and phenethylamine.

The amidine-based compound may consist of formamidine.

The divalent positive ion of the organic metal compound may be derived from an organic metal compound including a divalent positive ion. The organic metal compound including the divalent positive ion may include metal selected from the group consisting of lead (Pb), tin (Sn), germanium (Ge), antimony (Sb), bismuth (Bi), and barium (Ba).

In detail, the organic metal compound including the divalent positive ion may include a compound represented by the following Formula 1:

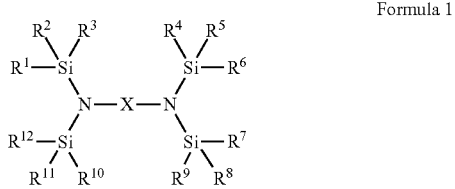

Formula 1

(In the Formula 1, each of R$^1$ to R$^{12}$ consists of hydrogen or an alkyl group independently, and X is selected from the group consisting of Pb, Sn, Ge, Sb, Bi, and Ba)

Alternatively, the organic metal compound including the divalent positive ion may be selected from among the group consisting of Pb(CH$_3$)$_4$, Pb(C$_2$H$_5$)$_4$, Pb(SCN)$_2$, (C$_2$H$_5$)$_3$PbOCH$_2$C(CH$_3$)$_3$, Pb(C$_{11}$H$_{19}$O$_2$)$_2$, Pb((CH$_3$)$_3$C—CO-CHCO—C(CH$_3$)$_3$)$_2$, Pb((C$_6$H$_5$)$_2$PCH$_2$P(C$_6$H$_5$)$_2$)$_2$, Pb(N(CH$_3$)$_2$C(CH$_3$)$_2$OH)$_2$, and C$_{12}$H$_{28}$ N$_2$O$_2$Pb.

A light absorption rate, an optical band gap, carrier mobility, and material stability of a finally obtained perovskite compound may be adjusted based on the kind of the organic metal compound including the divalent positive ion.

The halogen element may be derived from hydrogen halide. The hydrogen halide may be selected from the group consisting of HI, HBr, HF, and HCl. The optical band gap of the finally obtained perovskite compound may be adjusted based on the kind of the hydrogen halide.

The amine-based compound, the amidine-based compound, the organic metal compound including the divalent positive ion, and the hydrogen halide include a material which is vaporized at a temperature within a range of a room temperature to 200° C., and preferably, include a material which is vaporized at a temperature within a range of 50° C. to 150° C. Therefore, in a process of manufacturing a compound of the ABX$_3$, a chemical vapor deposition (CVD) process or an atomic layer deposition (ALD) process may be performed at a temperature of 200° C. or less (preferably, a temperature of 150° C. or less), and thus, an organic material of a finally obtained compound of ABX$_3$ may be prevented from being decomposed in performing the CVD process or the ALD process. Also, plasma may be applied in performing the CVD process or the ALD process.

The perovskite compound according to another embodiment of the present invention includes at least one selected from a monovalent organic positive ion of an amine-based compound and a monovalent organic positive ion of an amidine-based compound, a monovalent position ion of at least one alkali metal-based compound, a divalent positive ion of an organic metal compound, and one or more halogen elements. In general Formula, the perovskite compound may be represented by CABX$_3$.

In the CABX$_3$, the A may consist of the monovalent organic positive ion of the amine-based compound, the monovalent organic positive ion of the amidine-based compound, or the monovalent organic positive ion of the amine-based compound and the monovalent organic positive ion of the amidine-based compound.

In the CABX$_3$, the C may consist of the at least one alkali metal-based compound.

The CA may have a structure where the monovalent organic positive ion of the amine-based compound is included therein at an x ratio, the monovalent organic positive ion of the amidine-based compound is included therein at a y ratio, and a monovalent position ion of an alkali metal is included therein at a z ratio. In this case, each of x, y, and z is greater than 0, and x+y+z=1.

In the CABX$_3$, the B consists of the divalent positive ion, and the X consists of one or more halogen elements.

The amine-based compound, the amidine-based compound, the organic metal compound including the divalent positive ion, and the hydrogen halide are as described above, and thus, their repeated descriptions are omitted.

The alkali metal-based compound may include a compound represented by the following Formula 2:

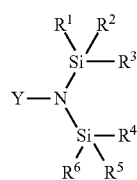

Formula 2

(In the Formula 2, each of $R^1$ to $R^6$ consists of hydrogen or an alkyl group independently, and the Y is an alkali metal)

As described above, according to another embodiment of the present invention, at least one alkali metal-based compound may be added to a reactant, and thus, the instability of a monovalent organic positive ion vulnerable to water, heat, and plasma may be complemented.

A bottom surface of the light absorption layer 310 and a top surface of the light absorption layer 310 have different optical band gaps. In detail, the bottom surface of the light absorption layer 310 have an optical band gap which is less than that of the top surface of the light absorption layer 310. In the present invention, an optical band gap denotes an energy difference between a highest energy level of a valence band and a lowest energy level of a conduction band, and a unit thereof is eV.

By adjusting the optical band gaps of the bottom surface and the top surface of the light absorption layer 310, a thickness of the perovskite solar cell 300 may be formed to be thin, and a current density may increase. In detail, the top surface of the light absorption layer 310 may be disposed relatively closer to a surface, on which sunlight is incident, than the bottom surface of the light absorption layer 310, and thus, the optical band gap of the top surface of the light absorption layer 310 may be formed to be greater than that of the bottom surface of the light absorption layer 310, thereby increasing a current density of the perovskite solar cell 300. In the present specification, description is given under the assumption that the top surface of the light absorption layer 310 is a surface which is disposed relatively closer to a surface, on which sunlight is incident, than the bottom surface of the light absorption layer 310. However, for example, when the bottom surface of the light absorption layer 310 is disposed relatively closer to a surface, on which sunlight is incident, than the top surface of the light absorption layer 310, a description thereof is opposite thereto.

According to an embodiment of the present invention, an optical band gap of an inner portion of the light absorption layer 310 may be constant or decrease toward the bottom surface from the top surface.

Figure 2:
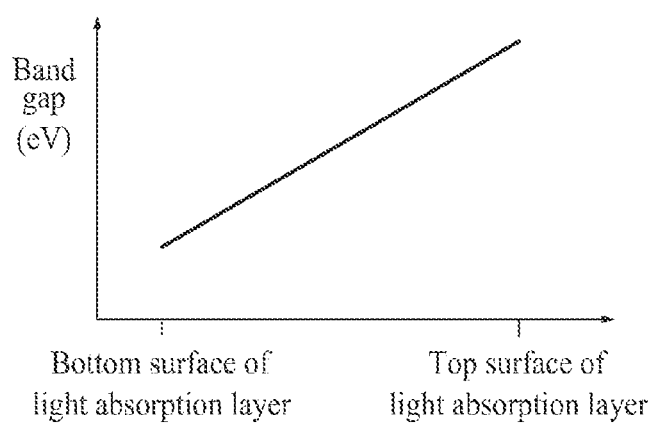
FIGS. 2 to 4 are graphs showing a variation of an optical band gap up to a top surface from a bottom surface of a light absorption layer according to various embodiments of the present invention.
Figure 3:
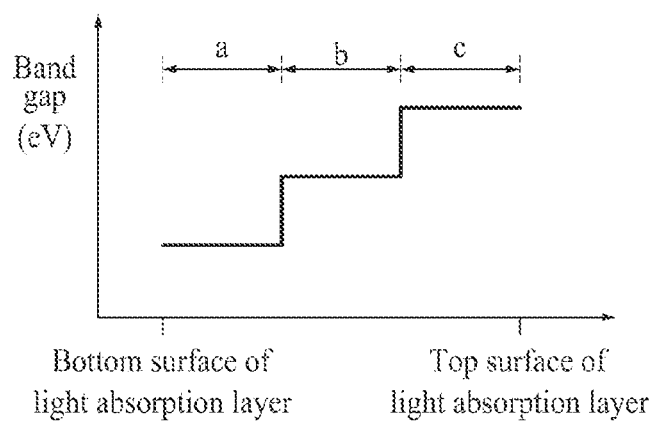
Figure 4:
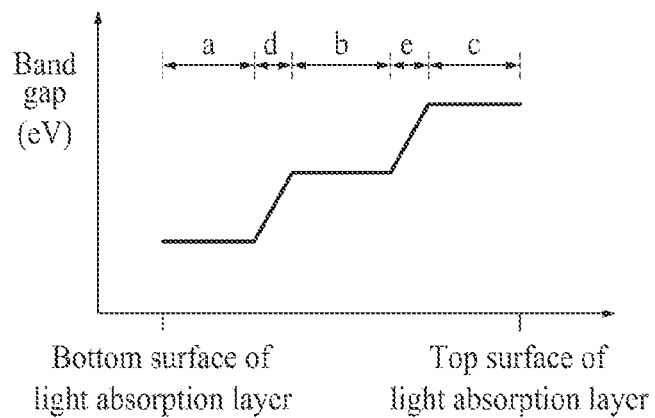

FIGS. 2 to 4 are graphs showing a variation of an optical band gap up to a top surface from a bottom surface of a light absorption layer 310 according to various embodiments of the present invention.

As seen in FIG. 2, in the light absorption layer 310 according to an embodiment of the present invention, an optical band gap may increase gradually up to a top surface thereof from a bottom surface thereof. Particularly, as illustrated, an optical band gap may increase gradually up to the top surface of the light absorption layer 310 from the bottom surface of the light absorption layer 310 to have a constant slope, but is not limited thereto and the slope may not be constant.

The perovskite compound included in the light absorption layer 310 may include a first halogen element X1 and a second halogen element X2.

A perovskite compound including each of the first halogen element X1 and the second halogen element X2 may be represented by $AB(X1)_m(X2)_n$. In this case, the A and the B are as described above, each of the m and the n is greater than 0, and m+n=3.

The first halogen element X1 has an optical band gap having a value which is greater than that of an optical band gap of the second halogen element X2. In this case, a content of the first halogen element X1 included in the top surface of the light absorption layer 310 may be higher than that of the first halogen element X1 included in the bottom surface of the light absorption layer 310, and a content of the second halogen element X2 included in the top surface of the light absorption layer 310 may be lower than that of the second halogen element X2 included in the bottom surface of the light absorption layer 310.

Moreover, in the bottom surface of the light absorption layer 310, a content of the second halogen element X2 having a relatively small optical band gap may be higher than that of the first halogen element X1 having a relatively large optical band gap, and in the top surface of the light absorption layer 310, a content of the first halogen element X1 having a relatively large optical band gap may be higher than that of the second halogen element X2 having a relatively small optical band gap.

A content of the first halogen element X1 of an inner portion of the light absorption layer 310 may be constant or decrease toward the bottom surface from the top surface, and a content of the second halogen element X2 thereof may be constant or increase toward the bottom surface from the top surface. Particularly, a content of the first halogen element X1 may decrease gradually toward the bottom surface of the light absorption layer 310 from the top surface thereof and a content of the second halogen element X2 may increase gradually toward the bottom surface of the light absorption layer 310 from the top surface thereof. And, a content of the second halogen element X2 may decrease gradually toward the top surface of the light absorption layer 310 from the bottom surface thereof and a content of the first halogen element X1 may increase gradually toward the top surface of the light absorption layer 310 from the bottom surface thereof.

To describe general Formula "$AB(X1)_m(X2)_n$" of the perovskite compound, the m may decrease and the n may increase toward the bottom surface of the light absorption layer 310 from the top surface thereof, and contrariwise, the m may increase and the n may decrease toward the top surface of the light absorption layer 310 from the bottom surface thereof.

As a content of the first halogen element X1 having a large optical band gap among the first and second halogen elements of the perovskite compound "$AB(X1)_m(X2)_n$" increases, an optical band gap of the perovskite compound may also increase, and as a content of the second halogen element X2 having a small optical band gap increases, an optical band gap of the perovskite compound may also decrease.

An optical band gap of fluorine (F) among fluorine (F), chlorine (Cl), bromine (Br), and iodine (I) is largest, an optical band gap of Cl is second large, an optical band gap of Br is third large, and an optical band gap of I is smallest. In detail, an optical band gap of Cl is 3.1 eV, and an optical band gap of I is 1.6 eV.

In a case where the perovskite compound includes each of Cl and I, when a content of Cl having a relatively large optical band gap increases, an optical band gap of the perovskite compound increases also, and when a content of I having a relatively small optical band gap increases, an optical band gap of the perovskite compound decreases also. Therefore, when the perovskite compound of the light absorption layer 310 includes Cl and I, a content of I may be higher than a content of Cl in the bottom surface of the light absorption layer 310 and a content of Cl may be higher than a content of I in the top surface of the light absorption layer 310, and particularly, a content of I may increase toward the bottom surface of the light absorption layer 310 from the top surface thereof and a content of Cl may increase toward the top surface of the light absorption layer 310 from the bottom surface thereof.

Moreover, according to another embodiment of the present invention, the perovskite compound included in the light absorption layer 310 may further include a third halogen element X3 in addition to the first halogen element X1 and the second halogen element X2. In this case, the perovskite compound including the first halogen element X1, the second halogen element X2, and the third halogen element X3 may be represented by $AB(X1)_m(X2)_n(X3)_o$. Each of the m, the n, and the o is greater than 0, and m+n+o=3.

The third halogen element X3 may have an optical band gap which is less than an optical band gap of the first halogen element X1 and is greater than an optical band gap of the second halogen element X2, and a content of the third halogen element X3 may increase and then decrease toward the top surface of the light absorption layer 310 from the bottom surface thereof. That is, in $AB(X1)_m(X2)_n(X3)_o$ of the perovskite compound, the "o" may increase and then decrease toward the top surface of the light absorption layer 310 from the bottom surface thereof. Depending on the case, a content of the third halogen element X3 may be uniform in all of the light absorption layer 310. When the first halogen element X1 consists of Cl and the second halogen element X2 consists of I, the third halogen element X3 may consist of Br.

As seen in FIG. 3, the light absorption layer 310 according to another embodiment of the present invention may include a first layer a where an optical band gap is smallest, a second layer b where an optical band gap is medium, and a third layer c where an optical band gap is largest, and thus, an optical band gap of the light absorption layer 310 may increase stepwise up to a top surface thereof from a bottom surface thereof. In this case, the first layer a where the optical band gap is smallest is a region adjacent to the bottom surface of the light absorption layer 310, and the third layer c where the optical band gap is largest is a region adjacent to the top surface of the light absorption layer 310.

The perovskite compound of the light absorption layer 310 according to FIG. 3 may include a first halogen element X1 and a second halogen element X2 having an optical band gap which is smaller than that of the first halogen element X1.

In this case, the first layer a where the optical band gap is smallest may include the second halogen element X2 and may not include the first halogen element X1, the second layer b where the optical band gap is medium may include all of the first halogen element X1 and the second halogen element X2, and the third layer c where the optical band gap is largest may include the first halogen element X1 and may not include the second halogen element X2.

Alternatively, each of the first layer a, the second layer b, and the third layer c may include all of the first halogen element X1 and the second halogen element X2, and in this case, a content of the first halogen element X1 is highest in the third layer c and is lowest in the first layer a, and a content of the second halogen element X2 is highest in the first layer a and is lowest in the third layer c.

The perovskite compound of the light absorption layer 310 according to FIG. 3 may include a first halogen element X1, a second halogen element X2 having an optical band gap which is smaller than that of the first halogen element X1, and a third halogen element X3 having an optical band gap which is less than that of the first halogen element X1 and is greater than that of the second halogen element X2.

In this case, a content of the first halogen element X1 and a content of the second halogen element X2 may be as described above, a content of the third halogen element X3 may be higher in the second layer b than the first layer a, and a content of the third halogen element X3 may be higher in the second layer b than the third layer c. Depending on the case, a content of the third halogen element X3 may be uniform in the first layer a, the second layer b, and the third layer c.

Alternatively, the first layer a may include the second halogen element X2 and may not include the first halogen element X1 and the third halogen element X3, the second layer b may include the third halogen element X3 and may not include the first halogen element X1 and the second halogen element X2, and the third layer c may include the first halogen element X1 and may not include the second halogen element X2 and the third halogen element X3.

As seen in FIG. 4, the light absorption layer 310 according to another embodiment of the present invention may include a first layer a where an optical band gap is smallest, a second layer b where an optical band gap is medium, and a third layer c where an optical band gap is largest, a fourth layer d provided between the first layer a and the second layer b, and a fifth layer e provided between the second layer b and the third layer c.

The first layer a, the second layer b, and the third layer c are the same as those of FIG. 3 described above.

An optical band gap of the fourth layer d may increase gradually up to an optical band gap of the second layer b from an optical band gap of the first layer a, and an optical band gap of the fifth layer e may increase gradually up to an optical band gap of the third layer c from an optical band gap of the second layer b. A configuration of each of the fourth layer d and the fifth layer e may be easily understood with reference to a configuration of FIG. 2.

A thin film of the perovskite compound configuring the light absorption layer 310 may be obtained through a process of reacting at least one compound selected from an amine-based compound and an amidine-based compound, an organic metal compound including a divalent positive ion, and at least one hydrogen halide.

The following Reaction Scheme 1 is a reaction scheme in a method of forming a thin film of a perovskite compound according to an embodiment of the present invention.

Reaction Scheme 1

CH$_3$NH$_2$    +

Methylamine

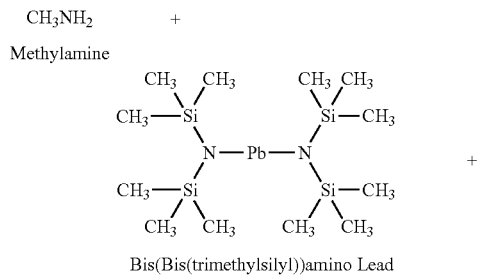

Bis(Bis(trimethylsilyl))amino Lead

-continued

HI ⟶ CH$_3$NH$_3$PbI$_3$ + MAPbI$_3$

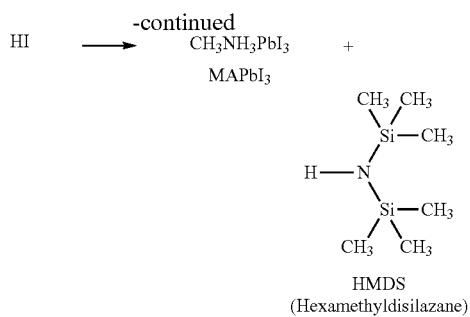

HMDS
(Hexamethyldisilazane)

As seen in the Reaction Scheme 1, by reacting methylamine, bis(bis(trimethylsilyl)amino lead as the organic metal compound including the divalent positive ion, and hydrogen iodide as hydrogen halide, a compound of CH$_3$NH$_3$PbI$_3$(MAPbI$_3$) is obtained as a perovskite compound, and moreover, hexamethyldisilanzane (HMDS) is obtained as a byproduct.

Although not shown in the Reaction Scheme 1, a byproduct of methylammonium iodide (CH$_3$NH$_3$I) may be obtained by reacting methylamine with hydrogen iodide, and a byproduct of PbI$_2$ may also be obtained by reacting bis(bis(trimethylsilyl)amino lead with hydrogen iodide.

In the Reaction Scheme 1, ethylamine or phenethylamine may be reacted instead of the methylamine, hydrogen bromide (HBr) or hydrogen chloride (HCl) may be reacted instead of the hydrogen iodide, or an organic metal compound obtained by substituting lead (Pb) of the bis(bis(trimethylsily)amino lead into Sn, Ge, Sb, Bi, or Ba may be reacted.

A thin film of a perovskite compound obtained from the following Reaction Scheme 1 may configure one layer of the first layer a, the second layer b, and the third layer c of FIG. 3 described above.

The following Reaction Scheme 2 is a reaction scheme in a method of forming a thin film of a perovskite compound according to another embodiment of the present invention in terms of a CVD process.

As seen in the Reaction Scheme 2, by reacting formamidine, bis(bis(trimethylsilyl)amino lead as an organic metal compound including a divalent positive ion, and hydrogen iodide as hydrogen halide, a compound of NH$_2$CHNH$_2$PbI$_3$ (FAPbI$_3$) is obtained as a perovskite compound, and moreover, hexamethyldisilanzane (HMDS) is obtained as a byproduct.

Although not shown in the Reaction Scheme 2, a byproduct of formamidinium iodide (NH$_2$CHNH$_2$I) may be obtained by reacting formamidine with hydrogen iodide, and moreover, a byproduct of PbI$_2$ may also be obtained by reacting bis(bis(trimethylsilyl)amino lead with hydrogen iodide.

In the Reaction Scheme 2, hydrogen bromide (HBr) or hydrogen chloride (HCl) may be reacted instead of the hydrogen iodide, or an organic metal compound obtained by substituting lead (Pb) of the bis(bis(trimethylsilyl)amino lead into Sn, Ge, Sb, Bi, or Ba may be reacted.

Band gap energy of a compound of NH$_2$CHNH$_2$PbI$_3$ (FAPbI$_3$) manufactured based on the Reaction Scheme 2 is 1.47 eV, and band gap energy of a compound of CH$_3$NH$_3$PbI$_3$(MAPbI$_3$) manufactured based on the Reaction Scheme 1 is 1.57 eV. That is, the band gap energy of the compound of NH$_2$CHNH$_2$PbI$_3$(FAPbI$_3$) manufactured based on the Reaction Scheme 2 is lower than the band gap energy of the compound of CH$_3$NH$_3$PbI$_3$(MAPbI$_3$) manufactured based on the Reaction Scheme 1. Therefore, in a case where the compound of NH$_2$CHNH$_2$PbI$_3$(FAPbI$_3$) manufactured based on the Reaction Scheme 2 is used as a light absorption layer of a solar cell, wider sunlight spectrum may be absorbed than a case where the compound of CH$_3$NH$_3$PbI$_3$(MAPbI$_3$) manufactured based on the Reaction Scheme 1 is used as the light absorption layer of the solar cell.

A thin film of a perovskite compound obtained from the following Reaction Scheme 2 may configure one layer of the first layer a, the second layer b, and the third layer c of FIG. 3 described above.

The following Reaction Scheme 3 is a reaction scheme in a method of forming a thin film of a perovskite compound according to another embodiment of the present invention in terms of a CVD process.

Reaction Scheme 2

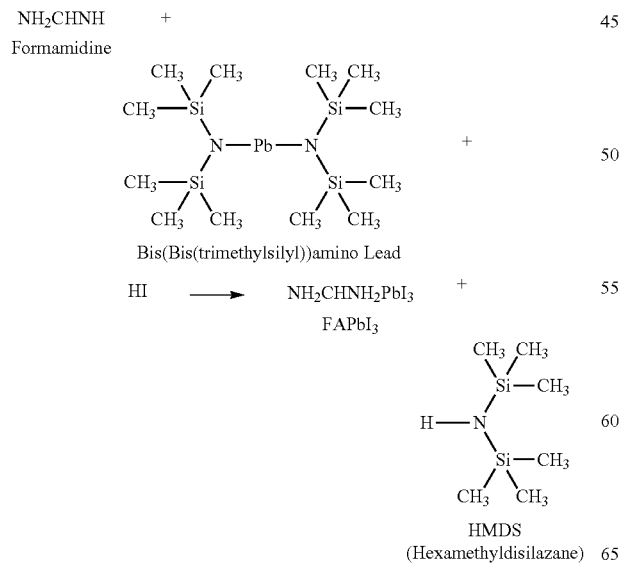

Reaction Scheme 3

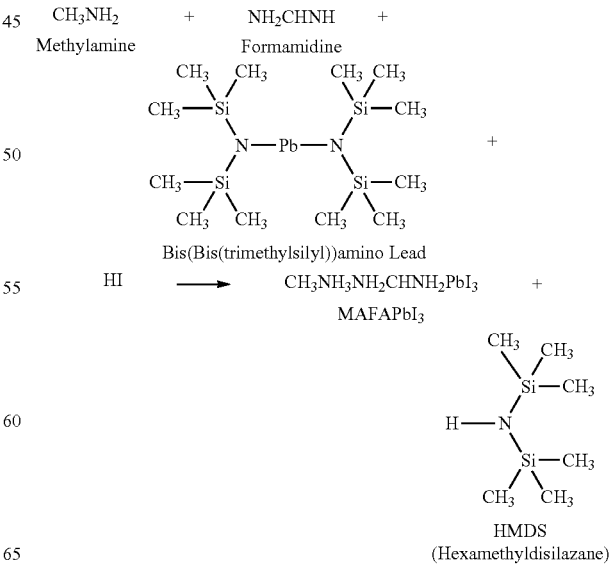

As seen in the Reaction Scheme 3, by reacting methylamine, formamidine, bis(bis(trimethylsilyl)amino lead as an organic metal compound including a divalent positive ion, and hydrogen iodide as hydrogen halide, a compound of $CH_3NH_3NH_2CHNH_2PbI_3$ ($MAFAPbI_3$) is obtained as a perovskite compound, and moreover, hexamethyldisilanzane (HMDS) is obtained as a byproduct.

Although not shown in the Reaction Scheme 3, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 3, ethylamine or phenethylamine may be reacted instead of the methylamine, hydrogen bromide (HBr) or hydrogen chloride (HCl) may be reacted instead of the hydrogen iodide, or an organic metal compound obtained by substituting lead (Pb) of the bis(bis(trimethylsilyl)amino lead into Sn, Ge, Sb, Bi, or Ba may be reacted.

A compound of $CH_3NH_3NH_2CHNH_2PbI_3$ ($MAFAPbI_3$) manufactured based on the Reaction Scheme 3 may have a plurality of monovalent positive ions, and thus, a perovskite solar cell having high efficiency may be obtained compared to a case where a compound of $CH_3NH_3NH_2CHNH_2PbI_3$ ($MAFAPbI_3$) manufactured based on the Reaction Scheme 3 is used as a light absorption layer of a solar cell.

A thin film of a perovskite compound obtained from the following Reaction Scheme 3 may configure one layer of the first layer a, the second layer b, and the third layer c of FIG. 3 described above.

The following Reaction Scheme 4 is a reaction scheme in a method of forming a thin film of a perovskite compound according to another embodiment of the present invention in terms of a CVD process.

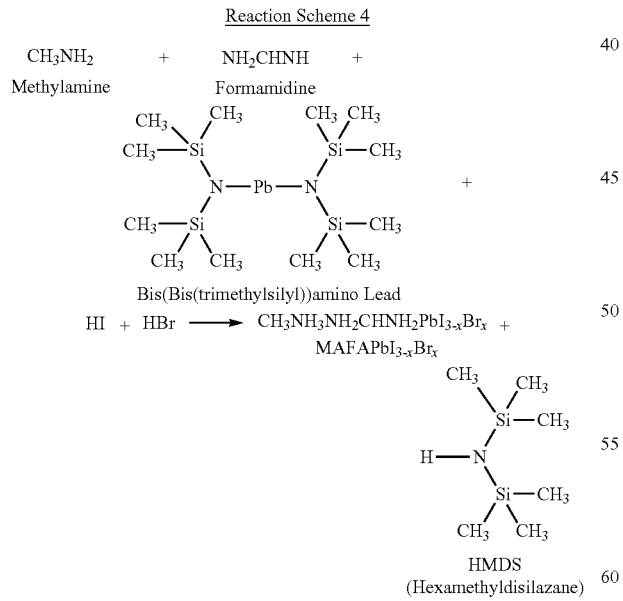

Reaction Scheme 4

As seen in the Reaction Scheme 4, by reacting methylamine, formamidine, bis(bis(trimethylsilyl)amino lead as an organic metal compound including a divalent positive ion, hydrogen iodide as hydrogen halide, and hydrogen bromide, a compound of $CH_3NH_3NH_2CHNH_2PbI_{3-x}Br_x$ (where x is an integer of 0 to 3) ($MAFAPbI_{3-x}Br_x$) is obtained as a perovskite compound, and moreover, hexamethyldisilanzane (HMDS) is obtained as a byproduct.

Although not shown in the Reaction Scheme 4, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 4, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsily)amino lead into Sn, Ge, Sb, Bi, or Ba may be reacted.

In the Reaction Scheme 4, a reaction may be performed by a method of decreasing the amount of added hydrogen iodide and increasing the amount of added hydrogen bromide over time.

A compound of $CH_3NH_3NH_2CHNH_2PbI_{3-x}Br_x$ (where x is an integer of 0 to 3) ($MAFAPbI_{3-x}Br_x$) manufactured based on the Reaction Scheme 4 may be obtained by doping a plurality of halogen materials, and a band gap may be precisely controlled to a wider range than a compound of $CH_3NH_3NH_2CHNH_2PbI_3$ ($MAFAPbI_3$) manufactured based on the Reaction Scheme 3.

A thin film of a perovskite compound obtained from the following Reaction Scheme 4 may configure one layer of the fourth layer d and the fifth layer e of FIG. 4 described above and the light absorption layer of FIG. 2 described above.

The following Reaction Scheme 5 is a reaction scheme in a method of forming a thin film of a perovskite compound according to another embodiment of the present invention in terms of a CVD process.

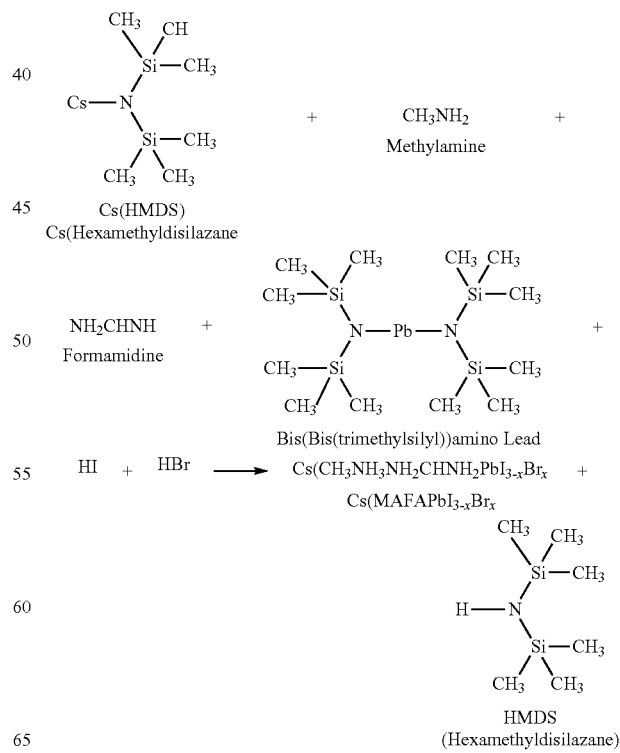

Reaction Scheme 5

As seen in the Reaction Scheme 5, by reacting Cs (hexamethyldisilanzane (HMDS)) as an alkali metal-based compound, methylamine, formamidine, bis(bis(trimethylsilyl)amino lead as an organic metal compound including a divalent positive ion, hydrogen iodide as hydrogen halide, and hydrogen bromide, a compound of $Cs(CH_3NH_3NH_2CHNH_2PbI_{3-x}Br_x)$ (where x is an integer of 0 to 3) ($Cs(MAFAPbI_{3-x}Br_x)$) is obtained as a perovskite compound, and moreover, hexamethyldisilanzane (HMDS) is obtained as a byproduct.

Although not shown in the Reaction Scheme 5, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 5, a reaction may be performed by a method of decreasing the amount of added hydrogen iodide and increasing the amount of added hydrogen bromide over time.

In the Reaction Scheme 5, an alkali metal-based compound obtained by substituting cesium (Cs) of the alkali metal-based compound into lithium (Li), sodium (Na), potassium (K), rubidium (Rb), or francium (Fr) may be reacted, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsily)amino lead into Sn, Ge, Sb, Bi, or Ba may be reacted. A thin film of a perovskite compound obtained from the following Reaction Scheme 5 may configure one layer of the fourth layer d and the fifth layer e of FIG. 4 described above and the light absorption layer of FIG. 2 described above.

The following Reaction Scheme 6 is a reaction scheme in a method of forming a thin film of a perovskite compound according to another embodiment of the present invention in terms of a CVD process.

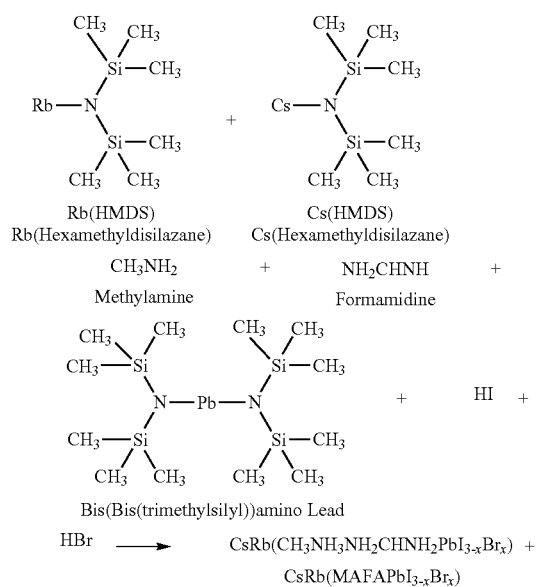

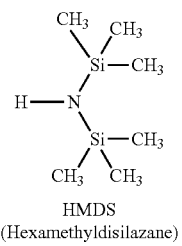

HMDS
(Hexamethyldisilazane)

As seen in the Reaction Scheme 6, by reacting Cs (hexamethyldisilanzane (HMDS)) and Rb(hexamethyldisilanzane (HMDS)) as an alkali metal-based compound, methylamine, formamidine, bis(bis(trimethylsilyl)amino lead as an organic metal compound including a divalent positive ion, hydrogen iodide as hydrogen halide, and hydrogen bromide, a compound of $CsRb(CH_3NH_3NH_2CHNH_2PbI_{3-x}Br_x)$ (where x is an integer of 0 to 3) ($CsRb(MAFAPbI_{3-x}Br_x)$) is obtained as a perovskite compound, and moreover, hexamethyldisilanzane (HMDS) is obtained as a byproduct.

Although not shown in the Reaction Scheme 6, a byproduct of methylammonium iodide ($CH_3NH_3I$) may be obtained by reacting methylamine with hydrogen iodide, a byproduct of formamidinium iodide ($NH_2CHNH_2I$) may be obtained by reacting formamidine with hydrogen iodide, and moreover, a byproduct of $PbI_2$ may also be obtained by reacting bis(bis(trimethylsilyl)amino lead with hydrogen iodide.

In the Reaction Scheme 6, a reaction may be performed by a method of decreasing the amount of added hydrogen iodide and increasing the amount of added hydrogen bromide over time.

In the Reaction Scheme 6, an alkali metal-based compound obtained by substituting cesium (Cs) or rubidium (Rb) of the alkali metal-based compound into lithium (Li), sodium (Na), potassium (K), or francium (Fr) may be reacted, ethylamine or phenethylamine may be reacted instead of the methylamine, hydrogen chloride (HCl) may be reacted instead of the hydrogen iodide or hydrogen bromide, or an organic metal compound obtained by substituting lead (Pb) of the bis(bis(trimethylsily)amino lead into Sn, Ge, Sb, Bi, or Ba may be reacted.

A thin film of a perovskite compound obtained from the following Reaction Scheme 6 may configure one layer of the fourth layer d and the fifth layer e of FIG. 4 described above and the light absorption layer of FIG. 2 described above.

Referring again to FIG. 1, the first electrode 400 is formed on an incident surface on which sunlight is incident, and thus, is patterned and formed in a certain shape. The second electrode 500 may be patterned and formed in a certain shape, and thus, may be configured so that reflected light of sunlight is incident on an inner portion of a solar cell. However, the present invention is not limited thereto.

Hereinabove, the tandem solar cell where the perovskite solar cell is stacked on the crystalline solar cell has been described, but the present invention is not limited to the tandem solar cell which includes a perovskite solar cell including the light absorption layer 310 described above.

FIGS. 5A to 5D are process cross-sectional views illustrating a method of manufacturing a solar cell according to an embodiment of the present invention.

Figure 5A:
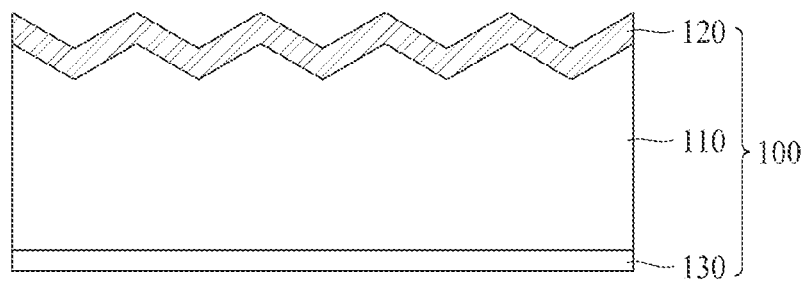
FIGS. 5A to 5D are process cross-sectional views illustrating a method of manufacturing a solar cell according to an embodiment of the present invention.

First, as seen in FIG. 5A, a crystalline solar cell 100 is manufactured.

The crystalline solar cell 100 is manufactured through a process of etching one surface (particularly, a top surface) of a semiconductor substrate 110 such as a wafer to form a concave-convex structure, doping a certain dopant on the one surface of the semiconductor substrate 110 to form a first semiconductor layer 120, and doping a certain dopant on the other surface of the semiconductor substrate 110 to form a second semiconductor layer 130.

As the one surface of the semiconductor substrate 110 is formed in the concave-convex structure, the first semiconductor layer 120 is formed in a shape corresponding to the concave-convex structure.

Moreover, in the drawing, an example is illustrated where the other surface (particularly, a bottom surface) of the semiconductor substrate 110 is formed in a flat structure and thus the second semiconductor layer 130 is also formed in a flat structure. However, the present invention is not limited thereto, and the other surface of the semiconductor substrate 110 may be formed in the concave-convex structure and the second semiconductor layer 130 may be formed in a shape corresponding to the concave-convex structure of the other surface of the semiconductor substrate 110. Depending on the case, the other surface (particularly, the bottom surface) of the semiconductor substrate 110 may be formed in a concave-convex structure and the one surface (particularly, the top surface) of the semiconductor substrate 110 may also be formed in a flat structure.

The semiconductor substrate 110 is formed of the P-type or N-type wafer described above, and thus, a repeated description of the light absorption layer is omitted.

Figure 5B:
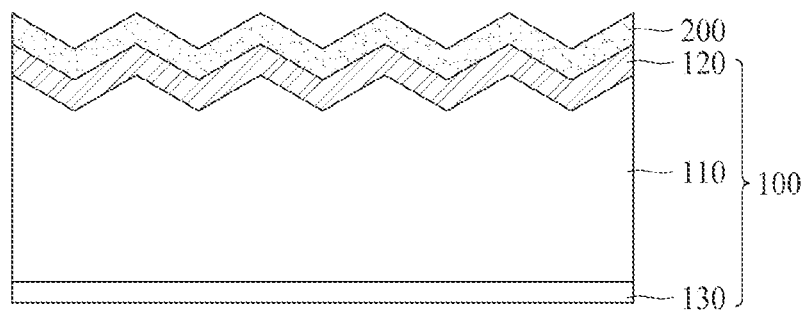

Subsequently, as seen in FIG. 5B, a buffer layer 200 is formed on the crystalline solar cell 100.

The buffer layer 200 is formed on the first semiconductor layer 120. As the first semiconductor layer 120 is formed in a concave-convex structure, the buffer layer 200 is formed in a shape corresponding to the concave-convex structure.

The buffer layer 200 is provided between the crystalline solar cell 100 and a below-described perovskite solar cell 300, and thus, a solar cell according to an embodiment of the present invention has a structure of a tandem solar cell on the basis of a tunnel junction.

It is preferable that the buffer layer 200 includes a material for enabling light having a long wavelength, passing through the perovskite solar cell 300, to be incident on the crystalline solar cell 100 without being lost. Therefore, a repeated description of the light absorption layer is omitted.

Figure 5C:
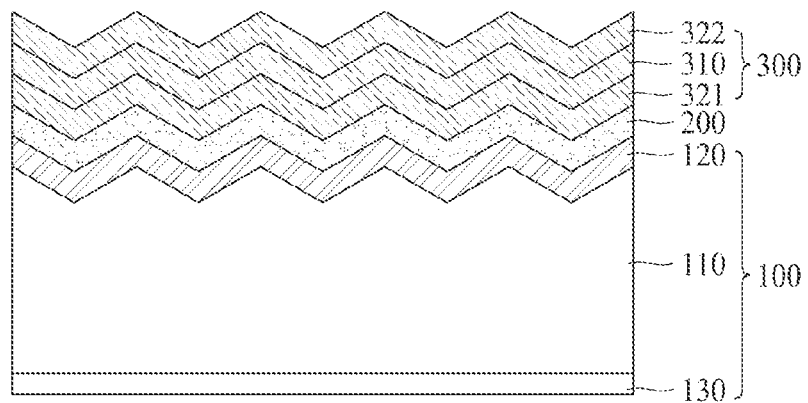

Subsequently, as seen in FIG. 5C, the perovskite solar cell 300 is formed on the buffer layer 200.

A process of forming the perovskite solar cell 300 may include a process of forming a first conductive charge transporting layer 321 on the buffer layer 200, a process of forming a light absorption layer 310 on the first conductive charge transporting layer 321, and a process of forming a second conductive charge transporting layer 322 on the light absorption layer 310.

The perovskite solar cell 300 may be formed by a CVD process or an ALD process described above, and a description thereof is omitted.

Figure 5D:
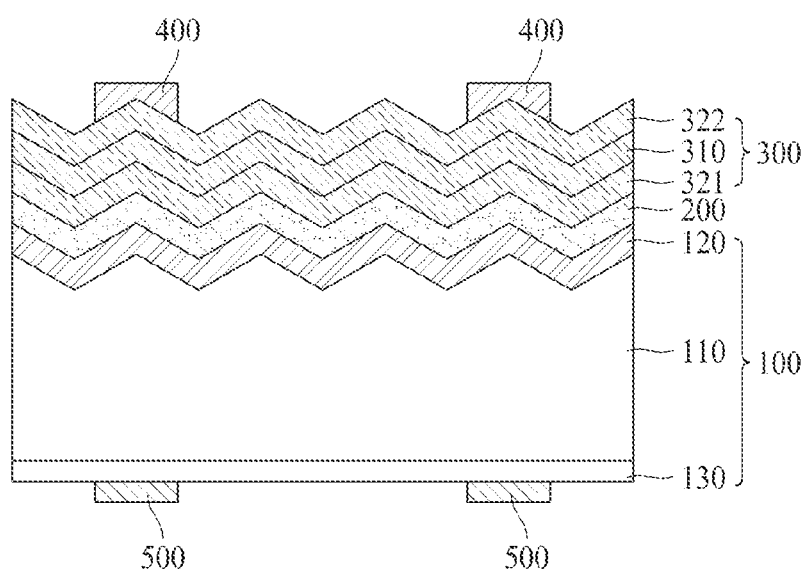

Subsequently, as seen in FIG. 5D, a first electrode 400 is formed on a top surface of the perovskite solar cell 300, and a second electrode 500 is formed on a bottom surface of the crystalline solar cell 100.

The first electrode 400 and the second electrode 500 are as described above, and their repeated descriptions are omitted.

Subsequently, as seen in FIG. 5E, a passivation layer 600 having a concave-convex structure is formed on the first electrode 400. At this time, the first electrode 400 may be exposed by etching a portion of the passivation layer 600.

As the passivation layer 600 is formed in a concave-convex structure, the amount of light incident on the perovskite solar cell 300 may increase.

The passivation layer 600 may be formed of polydimethylsiloxane, and when the polydimethylsiloxane is formed on the perovskite solar cell 300, a concave-convex structure having a micro pyramid structure may be obtained.

FIGS. 6A to 6E are process cross-sectional views illustrating a method of manufacturing a solar cell according to another embodiment of the present invention.

Figure 6A:
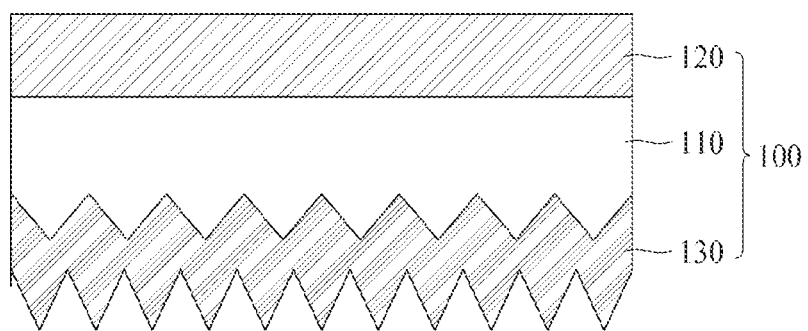
FIGS. 6A to 6E are process cross-sectional views illustrating a method of manufacturing a solar cell according to another embodiment of the present invention.

First, as seen in FIG. 6A, a crystalline solar cell 100 is manufactured.

The crystalline solar cell 100 may be manufactured through a process of etching a bottom surface of a semiconductor substrate 110 to form a concave-convex structure, doping a certain dopant on a top surface of the semiconductor substrate 110 to form a first semiconductor layer 120, and doping a certain dopant on the bottom surface of the semiconductor substrate 110 to form a second semiconductor layer 130.

As the bottom surface of the semiconductor substrate 110 is formed in the concave-convex structure, the second semiconductor layer 130 is formed in a shape corresponding to the concave-convex structure.

The first semiconductor layer 120 may be doped with a dopant having a polarity which differs from that of the semiconductor substrate 110, and the second semiconductor layer 130 may be doped with a dopant having a polarity which is identical to that of the semiconductor substrate 110.

Figure 6B:
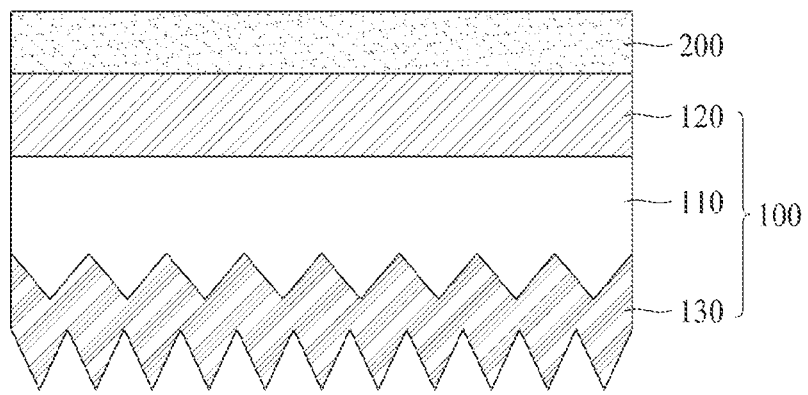

Subsequently, as seen in FIG. 6B, a buffer layer 200 is formed on a top surface of the crystalline solar cell 100.

The buffer layer 200 is formed on the first semiconductor layer 120. As the first semiconductor layer 120 is formed in a flat structure, the buffer layer 200 is also formed in a flat structure.

The buffer layer 200 is the same as the above-described embodiment, and thus, a repeated description is omitted.

Figure 6C:
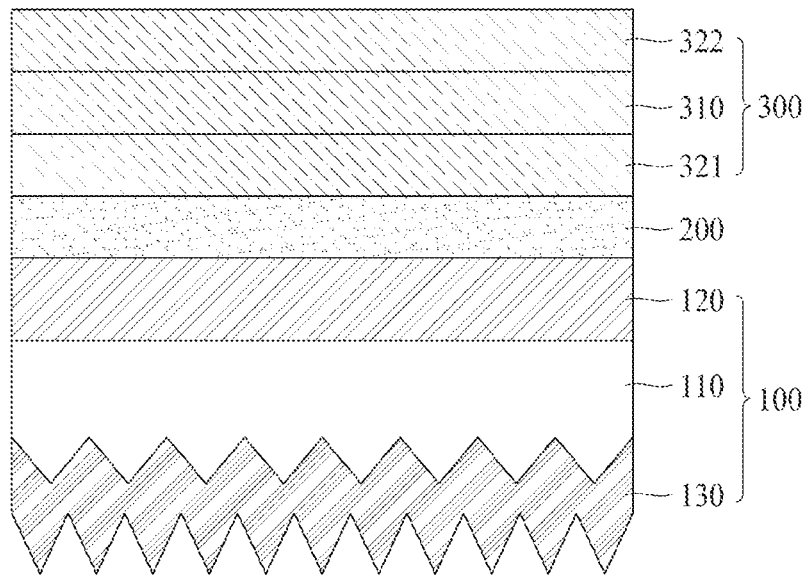

Subsequently, as seen in FIG. 6C, a perovskite solar cell 300 is formed on the buffer layer 200. As the buffer layer 200 is formed in a flat structure, the perovskite solar cell 300 may also be formed in a flat structure. The perovskite solar cell 300 is the same as the above-described embodiment, and thus, a repeated description is omitted.

Figure 6D:
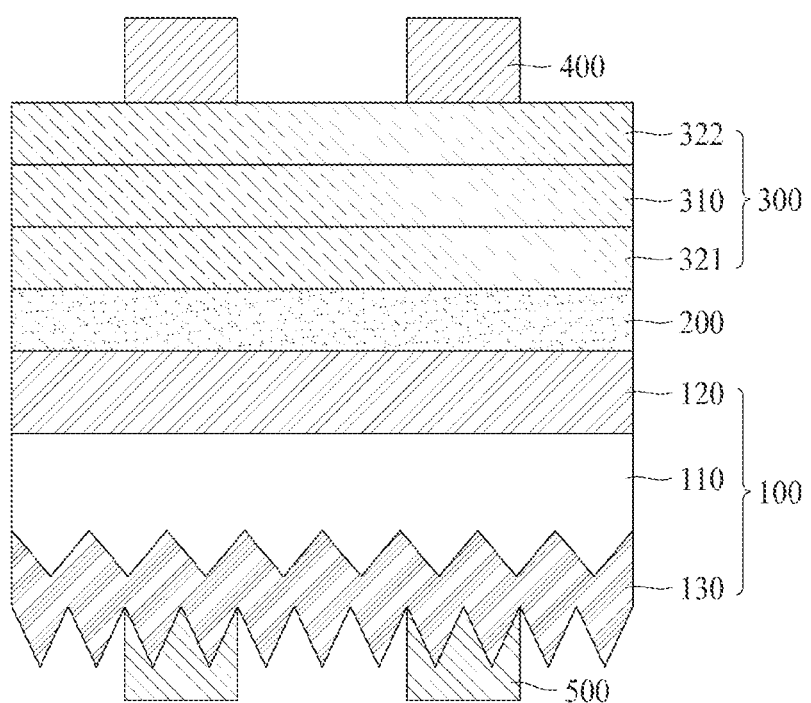

Subsequently, as seen in FIG. 6D, a first electrode 400 is formed on a top surface of the perovskite solar cell 300, and a second electrode 500 is formed on a bottom surface of the crystalline solar cell 100.

The first electrode 400 and the second electrode 500 are the same as the above-described embodiment, and thus, a repeated description is omitted.

Figure 6E:
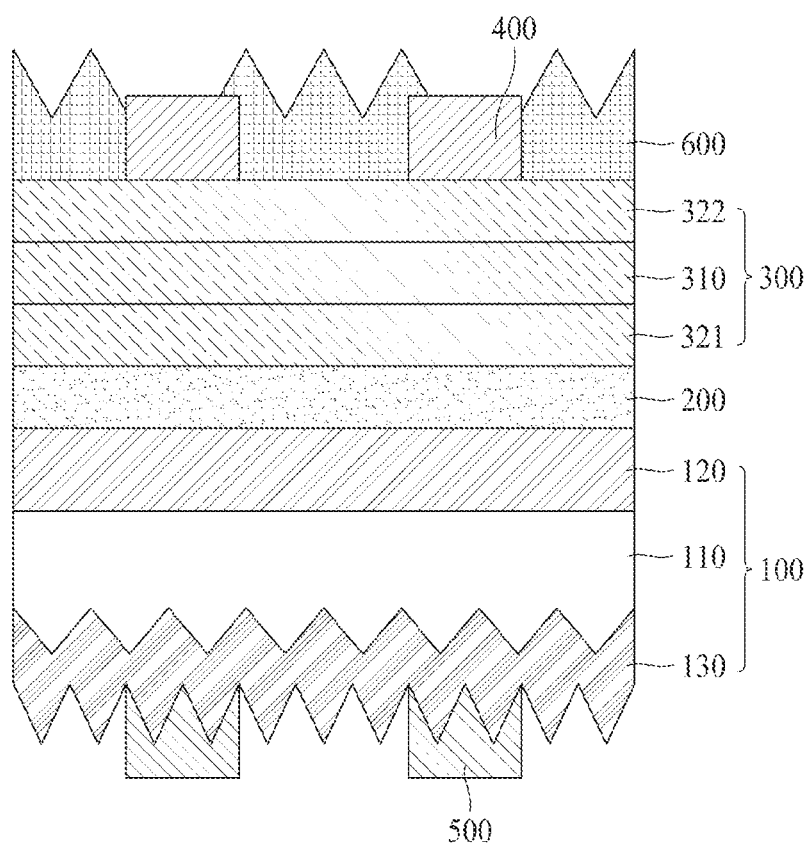

Subsequently, as seen in FIG. 6E, a passivation layer 600 having a concave-convex structure is formed on the first electrode 400. At this time, the first electrode 400 may be exposed by etching a portion of the passivation layer 600.

As the passivation layer 600 is formed in the concave-convex structure, the amount of light incident on the perovskite solar cell 300 may increase.

The passivation layer 600 may include polydimethylsiloxane, and when the polydimethylsiloxane is formed on the perovskite solar cell 300, a concave-convex structure having a micro pyramid structure may be obtained.

FIGS. 7A to 7E are process cross-sectional views illustrating a method of manufacturing a solar cell according to another embodiment of the present invention.

Figure 7A:
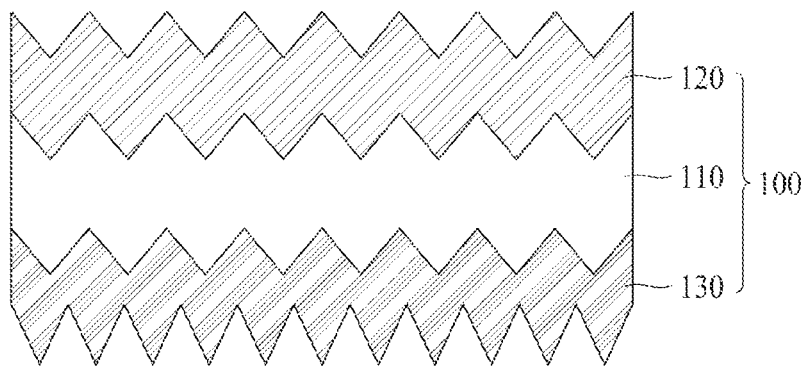
FIGS. 7A to 7E are process cross-sectional views illustrating a method of manufacturing a solar cell according to another embodiment of the present invention.

First, as seen in FIG. 7A, a crystalline solar cell 100 is manufactured.

The crystalline solar cell 100 is manufactured through a process of etching one surface and the other surface of a semiconductor substrate 110 to form a concave-convex structure, doping a certain dopant on the one surface of the semiconductor substrate 110 to form a first semiconductor layer 120, and doping a certain dopant on the other surface of the semiconductor substrate 110 to form a second semiconductor layer 130.

As the one surface and the other surface of the semiconductor substrate 110 are formed in the concave-convex structure, each of the first semiconductor layer 120 and the second semiconductor layer 130 is formed in a shape corresponding to the concave-convex structure.

The first semiconductor layer 120 may be doped with a dopant having a polarity which differs from that of the semiconductor substrate 110, and the second semiconductor layer 130 may be doped with a dopant having a polarity which is identical to that of the semiconductor substrate 110.

Figure 7B:
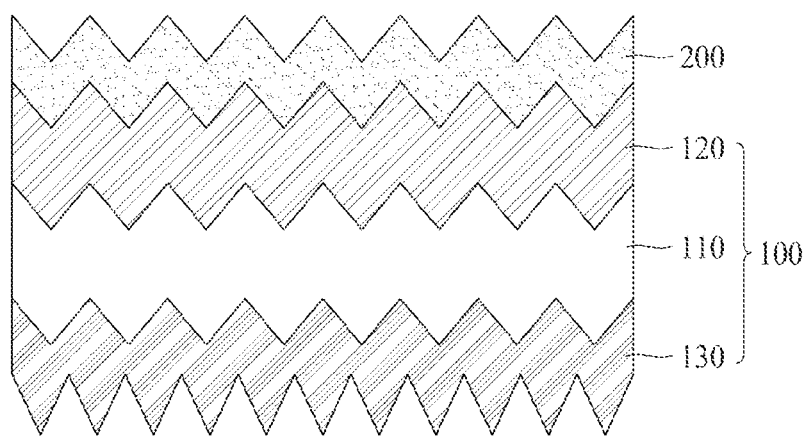

Subsequently, as seen in FIG. 7B, a buffer layer 200 is formed on a top surface of the crystalline solar cell 100.

The buffer layer 200 is formed on the first semiconductor layer 120. As the first semiconductor layer 120 is formed in a concave-convex structure, the buffer layer 200 is formed in the concave-convex structure.

The buffer layer 200 is the same as the above-described embodiment, and thus, a repeated description is omitted.

Figure 7C:
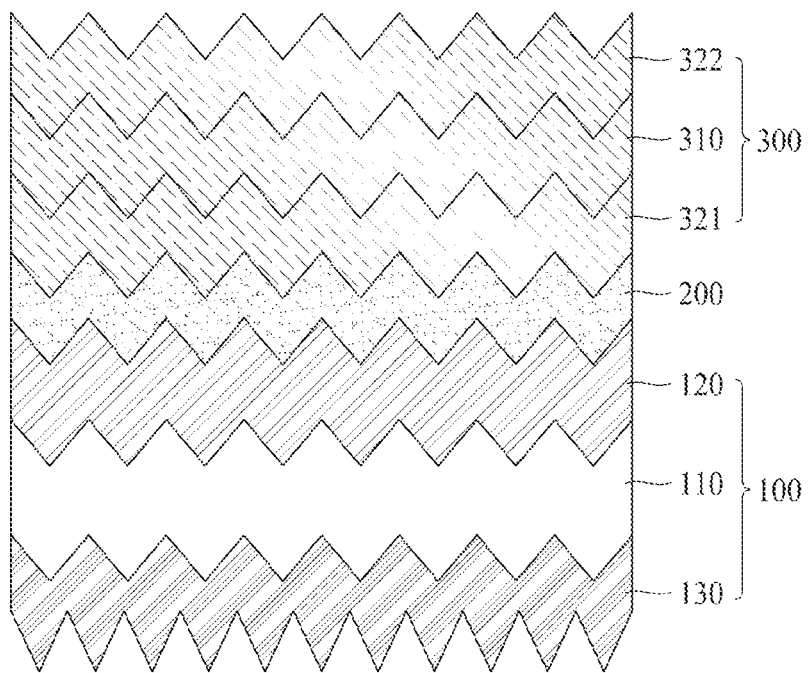

Subsequently, as seen in FIG. 7C, a perovskite solar cell 300 is formed on the buffer layer 200. As the buffer layer 200 is formed in the concave-convex structure, the perovskite solar cell 300 may be formed in a concave-convex structure. The perovskite solar cell 300 is the same as the above-described embodiment, and thus, a repeated description is omitted.

Figure 7D:
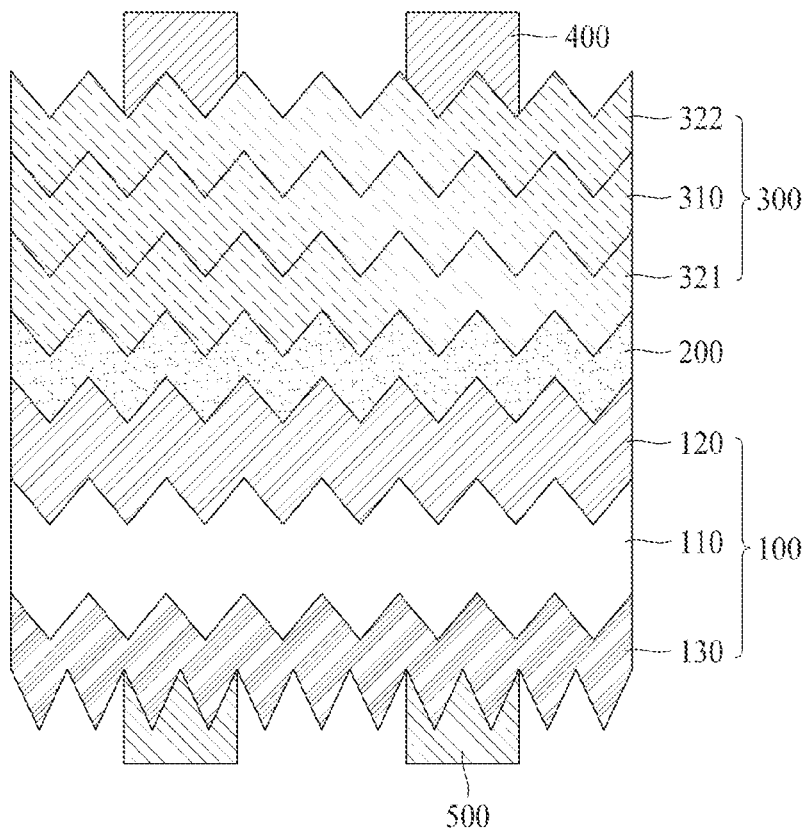

Subsequently, as seen in FIG. 7D, a first electrode 400 is formed on a top surface of the perovskite solar cell 300, and a second electrode 500 is formed on a bottom surface of the crystalline solar cell 100.

The first electrode 400 and the second electrode 500 are the same as the above-described embodiment, and thus, a repeated description is omitted.

Figure 7E:
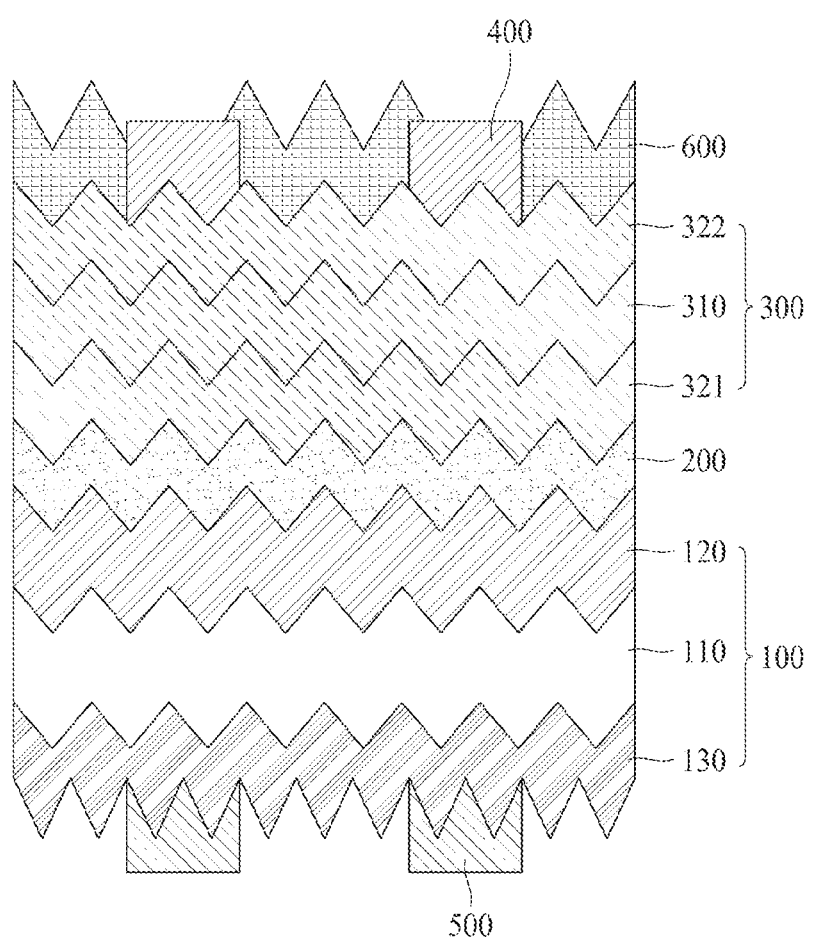

Subsequently, as seen in FIG. 7E, a passivation layer 600 is formed on the first electrode 400. At this time, the first electrode 400 may be exposed by etching a portion of the passivation layer 600.

As the perovskite solar cell 300 is formed in the concave-convex structure, the passivation layer 600 may be formed in a concave-convex structure. The passivation layer 600 may be formed of various materials such as SiO, SiON, SiN, $Al_2O_3$, or MgF.

Hereinabove, the embodiments of the present invention have been described in more detail with reference to the accompanying drawings, but the present invention is not limited to the embodiments and may be variously modified within a range which does not depart from the technical spirit of the present invention. Therefore, it should be understood that the embodiments described above are exemplary from every aspect and are not restrictive. It should be construed that the scope of the present invention is defined by the below-described claims instead of the detailed description, and the meanings and scope of the claims and all variations or modified forms inferred from their equivalent concepts are included in the scope of the present invention.

The invention claimed is:

1. A method of manufacturing a solar cell, the method comprising:
    a process of forming a light absorption layer including a perovskite compound; and
    a process of forming a conductive charge transporting layer in at least one of a first surface of the light absorption layer and a second surface of the light absorption layer opposite to the first surface,
    wherein the process of forming the light absorption layer comprises a process of reacting i) at least one compound selected from an amine-based compound and an amidine-based compound, ii) an organic metal compound including a divalent positive ion, and iii) at least one hydrogen halide,
    the first surface of the light absorption layer is disposed closer to an incident surface for sunlight than the second surface of the light absorption layer, and
    an optical band gap of the first surface of the light absorption layer is greater than an optical band gap of the second surface of the light absorption layer,
    wherein the light absorption layer comprises a first halogen element, a second halogen element, and a third halogen element,
    wherein an optical band gap of the first halogen element is greater than an optical band gap of the second halogen element,
    wherein an optical band gap of the third halogen element is less than the optical band gap of the first halogen element and is greater than the optical band gap of the second halogen element,
    wherein a content of the first halogen element of the first surface of the light absorption layer is higher than a content of the first halogen element of the second surface of the light absorption layer,
    wherein a content of the second halogen element of the first surface of the light absorption layer is lower than a content of the second halogen element of the second surface of the light absorption layer,
        wherein the light absorption layer comprises a first layer where an optical band gap is smallest, a second layer where an optical band gap is medium, a third layer where an optical band gap is largest, a fourth layer between the first layer and the second layer, and a fifth layer between the second layer and the third layer,
        wherein the first layer is adjacent to the first surface of the light absorption layer, the third layer is adjacent to the second surface of the light absorption layer, and
        wherein each optical band gap of the first layer, the second layer and the third layer is constant, an optical band gap of the fourth layer is gradually increased from the optical band gap of the first layer to the optical band gap of the second layer, and an optical band gap of the fifth layer is gradually increased from the optical band gap of the second layer to the optical band gap of the third layer.

2. The method of claim 1, wherein the hydrogen halide comprises a first hydrogen halide and a second hydrogen halide,
    a content of the first hydrogen halide supplied in forming the first surface of the light absorption layer is higher than a content of the first hydrogen halide supplied in forming the second surface of the light absorption layer, and
    a content of the second hydrogen halide supplied in forming the first surface of the light absorption layer is lower than a content of the second hydrogen halide supplied in forming the second surface of the light absorption layer.

3. The method of claim 1, wherein the hydrogen halide comprises a first hydrogen halide and a second hydrogen halide,
a content of the first hydrogen halide supplied in forming the first surface of the light absorption layer is higher than a content of the second hydrogen halide supplied in forming the first surface of the light absorption layer, and
a content of the first hydrogen halide supplied in forming the second surface of the light absorption layer is lower than a content of the second hydrogen halide supplied in forming the second surface of the light absorption layer.

4. The method of claim 1, wherein a process of forming a bulk-type solar cell and a process of forming a buffer layer on the bulk-type solar cell are further performed before forming the light absorption layer and the conductive charge transporting layer, and the light absorption layer and the conductive charge transporting layer are formed on the buffer layer.

5. The method of claim 1, wherein the first layer comprises the second halogen element and does not comprise the first halogen element, the second layer comprises the first halogen element and the second halogen element, and the third layer comprises the first halogen element and does not comprise the second halogen element.

6. The method of claim 1, wherein each of the first layer, the second layer, and the third layer comprises the first halogen element and the second halogen element, and a content of the first halogen element is highest in the third layer and is lowest in the first layer and a content of the second halogen element is highest in the first layer and is lowest in the third layer.

7. The method of claim 1, wherein a content of the third halogen element is higher in the second layer than the first layer or is higher in the second layer than the third layer or is uniform in the first layer, the second layer, and the third layer.

* * * * *